(12) United States Patent
Maruoka

(10) Patent No.: US 6,445,036 B1
(45) Date of Patent: Sep. 3, 2002

(54) SEMICONDUCTOR DEVICE HAVING TRENCH-STRUCTURED RECTANGULAR UNIT CELLS

(75) Inventor: Michiaki Maruoka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/643,764

(22) Filed: Aug. 23, 2000

(30) Foreign Application Priority Data

Aug. 23, 1999 (JP) ............................................. 11-236186

(51) Int. Cl.$^7$ ............................................... H01L 29/76
(52) U.S. Cl. ........................ 257/330; 257/331; 257/335; 257/401
(58) Field of Search .................................. 257/327–334, 257/401; 438/268–274

(56) References Cited

U.S. PATENT DOCUMENTS 5,414,290 A * 5/1995 Bauer .......................... 257/341
5,872,377 A * 2/1999 Jeon ............................ 257/341
6,005,271 A * 12/1999 Hshieh ......................... 257/341
6,281,547 B1 * 8/2001 So et al. ....................... 257/330

FOREIGN PATENT DOCUMENTS

JP          2894820          3/1999

* cited by examiner

*Primary Examiner*—Steven Loke
*Assistant Examiner*—Ori Nadav
(74) *Attorney, Agent, or Firm*—Sughrue Mion, PLLC

(57) ABSTRACT

A semiconductor device is provided which has a structure being suitable for scale-down of cells and is capable of, without an increase in channel resistance, improving a resistance property against device breakdown required when a semiconductor device breaks down due to inverse voltages applied. In the above semiconductor device, a source region narrowing section, in which width dimension on a plane of a source region is partially limited, is formed at the cell corner section disposed on diagonal lines and in a vicinity of the diagonal lines.

5 Claims, 9 Drawing Sheets

SEMICONDUCTOR DEVICE HAVING TRENCH-STRUCTURED RECTANGULAR UNIT CELLS

BACKGROUND OF THE INVENTION

1. Field of the Invention

The present invention relates to a semiconductor device and a method of manufacturing same and more particularly to the semiconductor device composed of a plurality of trench-structured rectangular unit cells.

2. Description of the Related Art

As one of power devices handling comparatively large currents and voltages, a MOSFET (Metal Oxide Semiconductor Field Effect Transistor) is widely used. The MOSFET has an advantage of requiring no input current to be used for control since it is a voltage control-type device. Moreover, since the MOSFET operates using either of an electron or a hole as a majority carrier and provides no carrier accumulation effects, it has excellent switching characteristics and high resistance against punch-through and therefore is applied to an inductive load such as a switching regulator or a like in many cases.

Instead of an early-type lateral MOSFET designed so as to pass an operating current (drain current) in a horizontal direction on a semiconductor substrate, a vertical MOSFET designed so as to pass the drain current in a vertical direction on the semiconductor substrate is becoming widespread. Since the vertical MOSFET is constructed of a large number of unit cells each being connected in parallel, it is possible to increase current capacity. In addition, a trench-structured vertical type MOSFET in which each unit cell has the trench structure is generally used. In the trench-structured vertical MOSFET, since a channel is formed in the vertical direction along a side face of the trench, not only its excellent applicability to inductive loads is provided but also scale-downs of each cell as well as reduction in channel resistance values are made possible.

FIG. 12 is a top view showing configurations of a conventional trench-structured vertical MOSFET. FIG. 13 is a perspective view of the trench-structured vertical MOSFET of FIG. 12 taken along a line F—F. As shown in FIG. 12 and FIG. 13, the conventional vertical MOSFET is composed of a plurality of trench-structured rectangular unit cells 59 each including an N-type drain region 53 containing an N$^-$-type semiconductor layer 52 constructed of an epitaxial layer containing a low impurity concentration (that is, semiconductor layer containing the low impurity concentration) formed on an N$^+$-type semiconductor substrate 51 (that is, semiconductor substrate containing a high impurity concentration), a P-type base region 54 formed by performing an ion implantation on the N$^-$-type semiconductor layer 52 constituting a part of the N-type drain region 53, a trench surrounding the P-type base region 54 with a depth reaching the N$^-$-type semiconductor layer 52, a gate electrode 57 made of polysilicon films surrounded by gate oxide films formed within a trench 55 and an N$^+$-type source region 58, with an N-type impurity implanted, having an endless/ring shape formed on a surface of the P-type base region 54 along the trench 55.

A surface of the unit cell 59 is covered with an interlayer dielectric 62 on which a source and base contact aperture section 63 is formed and a source electrode 64, made of, for example, aluminum alloy, is formed so that P-type base region 54 is connected with the N$^+$-type source region 58 through the above aperture section 63. Thus, to allow the trench-structured vertical MOSFET to be applied to inductive loads, it is expected that its channel resistance is reduced and "resistance property against device breakdown" is improved. The resistance property against device breakdown represents an index to know how much current flows when a semiconductor device breaks down due to inverse voltages induced between the drain and the source of the MOSFET when connected to the inductive load.

In the conventional MOSFET as shown in FIG. 12 and FIG. 13, in a case where the semiconductor device breaks down due to inverse voltages induced between the drain and the source of the MOSFET when connected to the inductive load, breakdown of the semiconductor device occurs first at cell corner sections 65 in four corners of the unit cell 59 constituting the semiconductor device where the trenches 55 intersect and electric fields concentrate. There is therefore a shortcoming in such conventional MOSFETs that, since breakdown current causes a parasitic bipolar transistor composed of the N-type drain region 53, P-type base region 54 and N$^+$-type source region 58 to be turned ON, the above resistance property against device breakdown is reduced.

A trench-structured vertical MOSFET attempting to prevent such reduction in the resistance property against device breakdown is disclosed in, for example, Japanese Patent Gazette No. 2894820. FIG. 9 is a top view showing configurations of the trench-structured vertical MOSFET disclosed in the above Japanese Patent Gazette. FIG. 10 is a perspective view of the trench-structured vertical MOSFET of FIG. 9 taken along a line D—D. FIG. 11 is a perspective view of the trench-structured vertical MOSFET of FIG. 9 taken along a line E—E. In the trench-structured vertical MOSFET as shown in FIG. 9 to FIG. 11, a P-type region 66, not the N$^+$-type source region 58, is formed at cell corner sections 65 in four corners of the unit cell 59, where electric fields concentrate. In the trench-structured vertical MOSFET having such configurations, even if the breakdown current flows through current paths "d" and "e" extending from the N-type drain region 53 to a side (channel layer) of the P-type base region 54 and to a surface of the P-type base region 54, since no N$^+$-type source region 58 does not exist in the cell corner sections 65, the parasitic bipolar transistor is not easily turned ON, thus enabling improvement of a resistance property against device breakdown. Moreover, in FIG. 9 to FIG. 11, same reference numbers are assigned to same parts as those in FIG. 12 and FIG. 13.

However, the conventional semiconductor device disclosed in the above Japanese Patent Gazette No. 2894820 has a problem in that, since a source region is not formed at cell corner sections of a unit cell, a channel layer is not formed at the cell corner sections, causing an increase in channel resistance. That is, in the semiconductor device shown in the above Japanese Patent Gazette, since no source region 58 exists in the cell corner sections 65, the resistance property against device breakdown can be improved, however, extension of the path of the planar channel layer ends in the cell corner sections 65, thus causing a small width of the channel layer, resulting in increase in the channel resistance value.

Moreover, in the semiconductor device described above, since no source region 58 exists in the cell corner sections 65, when a cell is to be scaled down, the width of the channel has to be made smaller, which is not suitable for the scale-down of cells.

SUMMARY OF THE INVENTION

In view of the above, it is an object of the present invention to provide a semiconductor device having configurations being suitable for scale-down of cells which is capable of, without an increase in channel resistance, improving resistance against device breakdown required when the semiconductor device breaks down due to inverse voltages and a method of manufacturing a same.

According to a first aspect of the present invention, there is provided a semiconductor device having a plurality of trench-structured rectangular unit cells including:

a first conductive type drain region;

a second conductive type base region formed adjacent to the first conductive type drain region;

a trench formed in area surrounding the second conductive type base region;

a gate electrode formed within the trench with a gate insulating film interposed between the gate electrode and the trench;

a first conductive type source region having an endless/ring shape formed along the trench on a surface of the second conductive type base region; and a region having no source is formed at a center of a rectangular surface of the trench-structured rectangular unit cell and on diagonal lines radially extending from the center of the trench-structured rectangular unit cell.

According to a second aspect of the present invention, there is provided a semiconductor device having a plurality of trench-structured rectangular unit cells including:

a first conductive type drain region;

a second conductive type base region formed adjacent to the first conductive type drain region;

trench formed in area surrounding the second conductive type base region;

a gate electrode formed within the trench with a gate insulating film interposed between the gate electrode and the trench;

a first conductive type source region having an endless/ring shape formed along the trench on a surface of the second conductive type base region; and a source region narrowing section which partially limits width dimensions on a plane of the first conductive type source region is formed on diagonal lines on a rectangular surface of the trench-structured rectangular unit cell and in a vicinity of the diagonal lines of the trench-structured rectangular unit cell.

In the foregoing, a preferable mode is one wherein the trench-structured rectangular unit cell is coated with an interlayer dielectric in which a source and base contact aperture section are formed and a source electrode is formed through the source and base contact aperture section.

Also, a preferable mode is one wherein the first conductive type source region narrowing section is so structured that the first conductive type source region is narrowed by an arbitrary dimension on diagonal lines of the trench-structured rectangular unit cell in a direction from the source and base contact aperture section in the interlayer dielectric toward a cell corner section.

Also, a preferable mode is one wherein the source region narrowing section is formed at a time of formation of the first conductive type source region after a second conductive semiconductor region containing an impurity concentration being higher than that of the second conductive type base region is formed in advance at a part of a place where the first conductive type source region is to be formed.

According to a third aspect of the present invention, there is provided a method for manufacturing semiconductor devices composed of a plurality of trench-structured rectangular unit cells having steps of forming a second conductive type base region adjacent to a first conductive type drain region, forming trench in area surrounding the second conductive type base region, forming a gate electrode within the trench with a gate insulating film interposed between the gate electrode and the trench, forming a first conductive type source region having an endless/ring shape along the trench on a surface of the second conductive type base region, the method including steps of:

forming the first conductive type drain region by forming a first conductive type semiconductor layer containing an impurity concentration being lower than that of the first conductive type semiconductor layer on a first conductive type semiconductor substrate;

partitioning the first conductive type semiconductor layer into a plurality of unit cells by forming trenches in the first conductive type semiconductor layer existing in area surrounding a place where the second conductive type base region is to be formed;

forming the second conductive type base region on a whole surface of the first conductive type semiconductor layer surrounded by the trenches; and forming, in a selective order, a first conductive type source region having an endless/ring shape on the surface of the second conductive type base region and a source region narrowing section which limits width dimensions on a plane of the first conductive type source region on diagonal lines on a rectangular surface of the unit cell and in a vicinity of diagonal lines of the unit cell.

In the foregoing, a preferable mode is one wherein, in a first conductive type source region forming process, after a photoresist film patterned so as to have planar shapes of a center portion of the second conductive type base region and of portions formed on diagonal lines extending radially from an area surrounding a center part of the trench-structured rectangular unit cell is formed on the second conductive type base region, a first conductive type impurity is introduced using the photoresist film as a mask.

Also, a preferable mode is one wherein the first conductive type source region forming process is constructed by combining a first impurity introducing process in which, after a first photoresist film patterned to have planar shapes of a center portion of the second conductive type base region and of portions formed on diagonal lines extending radially from the area surrounding the center part of the trench-structured rectangular unit cell is formed on the second conductive type base region, a second conductive type impurity is introduced using the first photoresist film as the mask so that the second conductive semiconductor layer contains an impurity concentration being higher than that of the second conductive] type base region, with a second impurity introducing process in which a second photoresist film patterned to have planar shapes of the center portion of the second conductive type base region and of portions formed on diagonal lines extending radially from the area surrounding the center part of the trench-structured rectangular unit cell is formed on the second conductive type base region, a first conductive type impurity is introduced using the second photoresist film as the mask.

Also, a preferable mode is one wherein a gate electrode forming process in which, after gate insulating film is formed on at least one side face of the trench, a gate electrode is formed within the trench with the gate insulating film interposed between the gate electrode and the trench, is contained between trench forming process and base region forming process.

Furthermore, a preferable mode is one wherein introduction of the first conductive type impurity and the second conductive type impurity in the base region forming process and source region forming process is performed by an ion implantation method.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
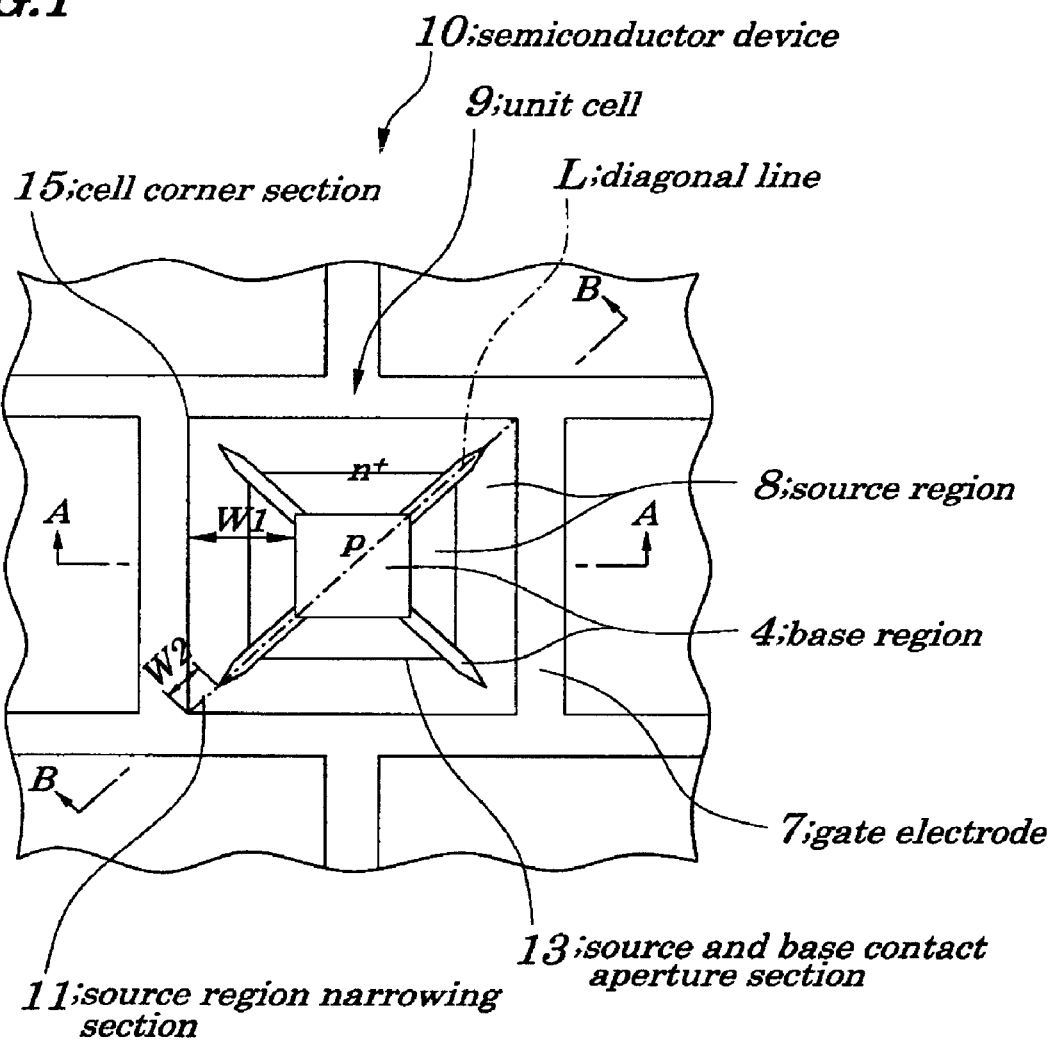
FIG. 1 is a top view showing configurations of a semiconductor device according to a first embodiment of the present invention.
Figure 2:
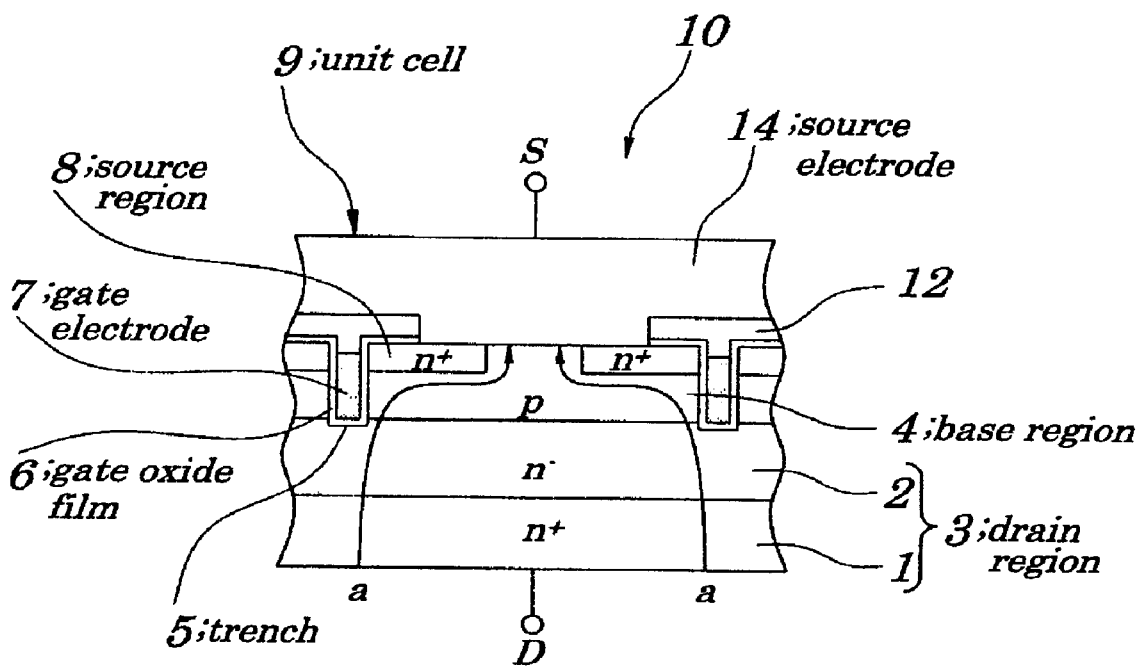
FIG. 2 is a perspective view of the semiconductor device of FIG. 1 taken along line A—A.
Figure 3:
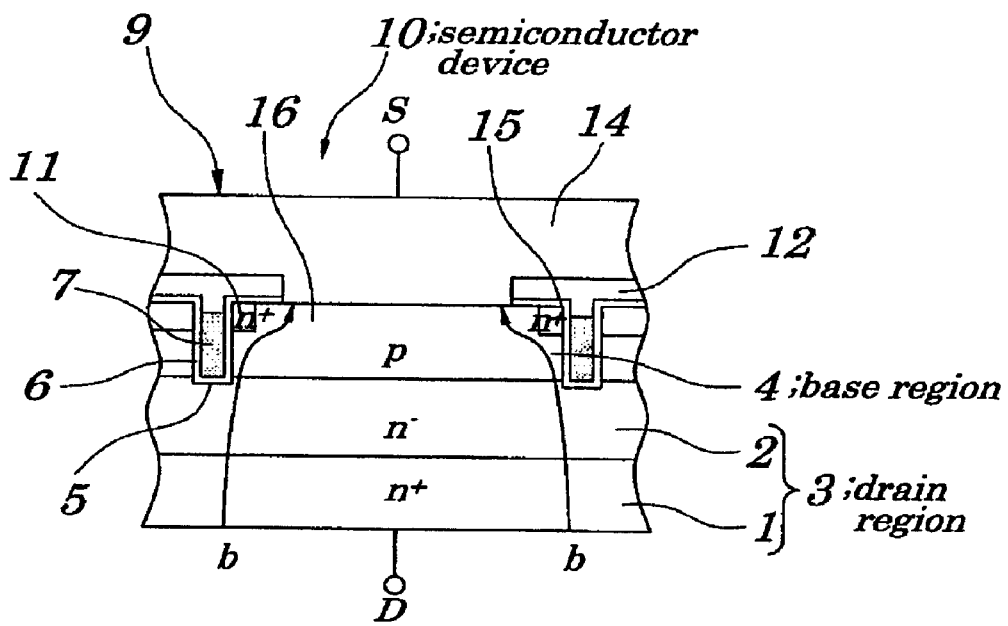
FIG. 3 is a perspective view of the semiconductor device of FIG. 1 taken along line B—B.

FIG. 1 is a top view showing configurations of a semiconductor device 10 according to a first embodiment of the present invention. FIG. 2 is a perspective view of the semiconductor device 10 of FIG. 1 taken along line A—A. FIG. 3 is a perspective view of the semiconductor device 10 of FIG. 1 taken along line B—B. FIGS. 4A to 6B are diagrams showing processes for manufacturing the semiconductor device 10 of FIG. 1.

The semiconductor device 10 of this embodiment, as shown in FIG. 1 to FIG. 3, is composed of a plurality of trench-structured rectangular unit cells 9 each including an N-type drain region 3 containing an $N^-$-type semiconductor layer 2 constructed of an epitaxial layer containing a low impurity concentration (that is, semiconductor layer containing the low impurity concentration) formed on an $N^+$-type semiconductor substrate 1 (that is semiconductor substrate containing a high impurity concentration), a P-type base region 4 formed by performing an ion implantation on the $N^-$-type semiconductor layer 2 constituting a part of the N-type drain region 3, a trench 5 surrounding the P-type base region 4 with a depth reaching the $N^-$-type semiconductor layer 2, a gate electrode 7 made of polysilicon films surrounded by gate oxide films 6 formed in the trench 5 and an $N^+$-type source region 8, with an N-type impurity implanted, having an endless/ring shape formed on a surface of the P-type base region 4 along the trench 5.

As shown in FIGS. 1 and 3, on a diagonal line L and in a vicinity of the diagonal line L, that is, in a cell corner section 15, on rectangular surface of the unit cell 9 is formed a source region narrowing section 11 which places a limit on width dimensions W1 on a plane of the $N^+$-type source region 8. The source region narrowing section 11 has the width dimensions W2 (W2<W1) on a plane of the diagonal line L. A region where no source is formed is provided on the center portion on the rectangular surface of the unit cell 9 and on the diagonal line L extended radially from four corners on the center of the unit cell 9. Thus, by partially limiting the width dimension W1 on the plane of the $N^+$-type source region 8 having the endless shape in the cell corner section 15, in particular, on the rectangular surface of the unit cell 9 to the width dimension W2, a resistance property against device breakdown required when the semiconductor device 10 breaks down due to inverse voltages can be improved without increase in channel resistance.

The surface of the unit cell 9 is covered with interlayer dielectric 12 of silicon oxide film on which a source and base contact aperture section 13 is formed and a source electrode 14 made of, for example, aluminum alloy is formed so that the P-type base region 4 is connected to the $N^+$-type source region 8 through the source and base contact aperture section 13.

To activate the semiconductor device 10 of this embodiment, with a positive voltage applied to the N-type drain region 3, by supplying the positive voltage exceeding a threshold voltage to the gate electrode 7, a channel layer is produced on a side of the trench 5 which brings $N^+$-type source region 8 and N-type drain region 3 into conduction, causing the semiconductor device 10 to be turned ON. By supplying the voltage being not more than the threshold voltage to the gate electrode 7, the channel layer disappears, causing the semiconductor device 10 to be turned OFF.

In the semiconductor device 10 of the embodiment, if the semiconductor device 10 breaks down due to inverse voltage induced between its drain and its source when the semiconductor device 10 is connected to inductive loads, as shown in FIG. 2, a current path "a", at a place other than the cell corner sections 15 of the unit cell 9, extending from the side of the N-type drain region 3 to the side (channel layer) of the P-type base region 4 and extending to the surface of the P-type base region 4 is formed, through which a breakdown current flows and, as shown in FIG. 3, a similar current path "b" is formed at the cell corner section 15 of the unit cell 9, through which the breakdown current flows. Since the breakdown occurs first at the cell corner section 15 where the trenches 5 of the unit cell 9 intersect and electric fields concentrate, the breakdown in the current path "b" determines the resistance property against device breakdown.

As is apparent from FIG. 1 and FIG. 3, since, by providing the source region narrowing section 11, the width dimension on the plane of the $N^+$-type source region B is smaller by approximately width (W1–W2) in the cell corner sections 15, distance from the N-type drain region 3 to a source electrode 14 in the current path "b" described above is shorter than in the current path "a" and the current path is formed on the surface of the P-type base region 4 having low resistance. Therefore, the voltage drop occurring when current flows through the P-type base region 4 becomes small, causing a parasitic bipolar transistor not to be easily turned ON. This enables the resistance property against device breakdown to be improved accordingly.

Moreover, in the semiconductor device 10 of the embodiment, the $N^+$-type source region 8 to be formed along the trench 5 is continuously formed through the source region narrowing section 11, producing no disconnected portion. This allows the $N^+$-type source region 8 to keep its endless shape and therefore the channel width in the $N^+$-type source region 8 to be increased, thus enabling reduction in the channel resistance. In addition, since there is the $N^+$-type source region 8 in the cell corner section 15, it is possible to construct the semiconductor device 10 so as to have configurations suitable for scale-down of the unit cell 9. Thus, according to the embodiment, the semiconductor device 10 can be provided which has configurations being suitable for scale-down of unit cells 9 and is capable of, without increase in channel resistance, improving resistance property against device breakdown required when the device breaks down due to inverse voltages.

Figure 4A:
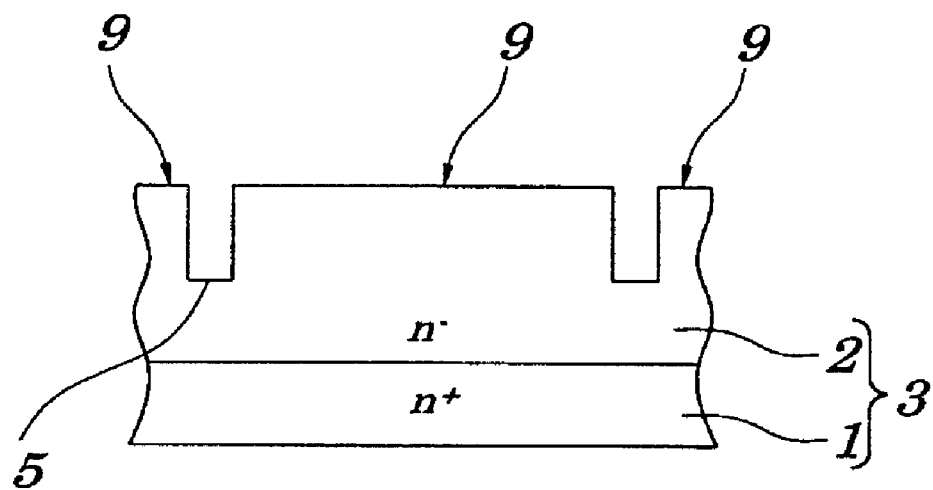
FIGS. 4A and 4B are diagrams showing processes for manufacturing the semiconductor device of FIG. 1.
Figure 4B:
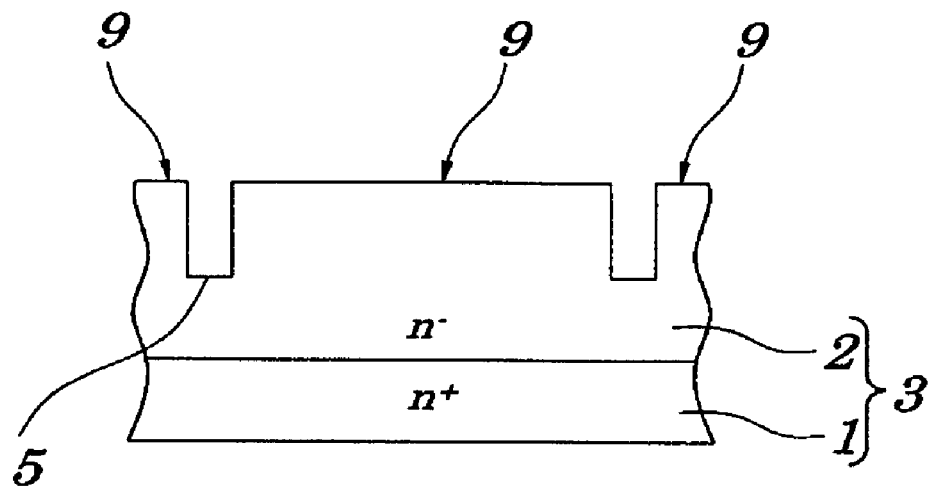
Figure 5A:
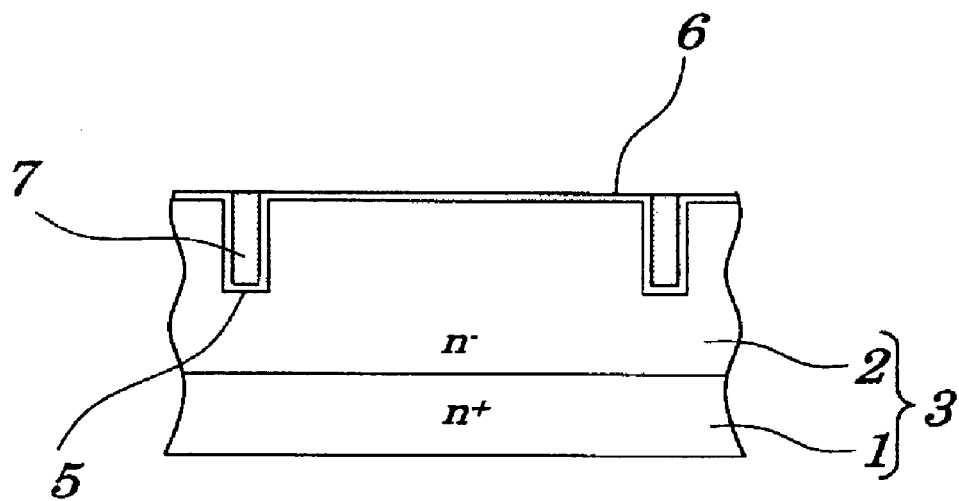
FIGS. 5A and 5B are diagrams showing processes for manufacturing the semiconductor device of FIG. 1.
Figure 5B:
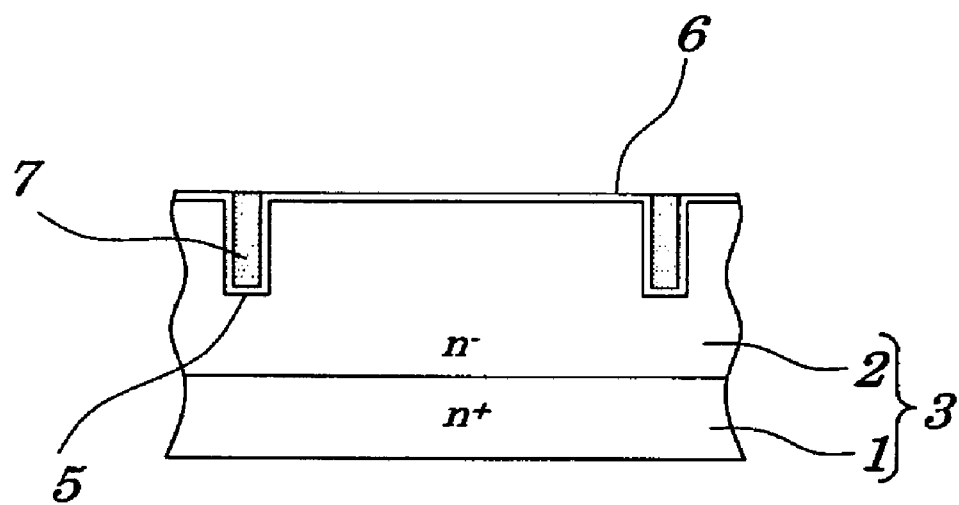
Figure 6A:
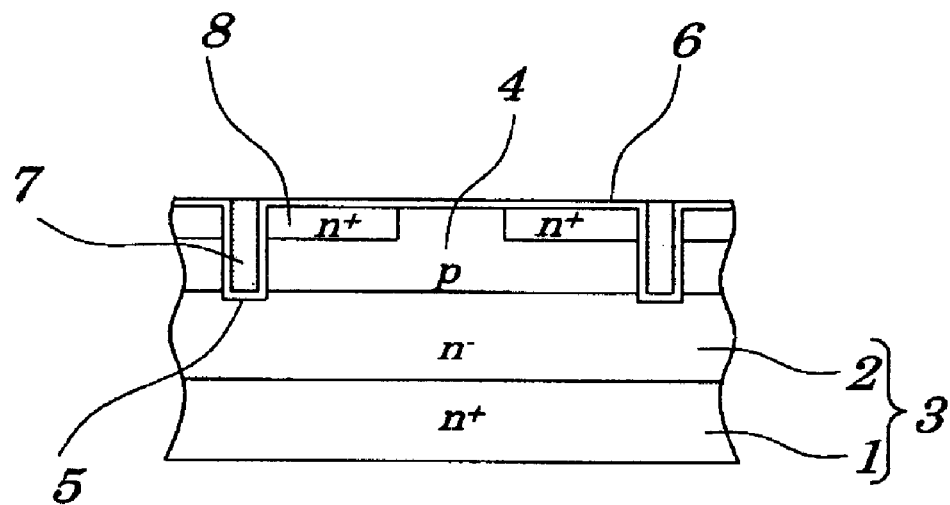
FIGS. 6A and 6B are diagrams showing processes for manufacturing the semiconductor device of FIG. 1.
Figure 6B:
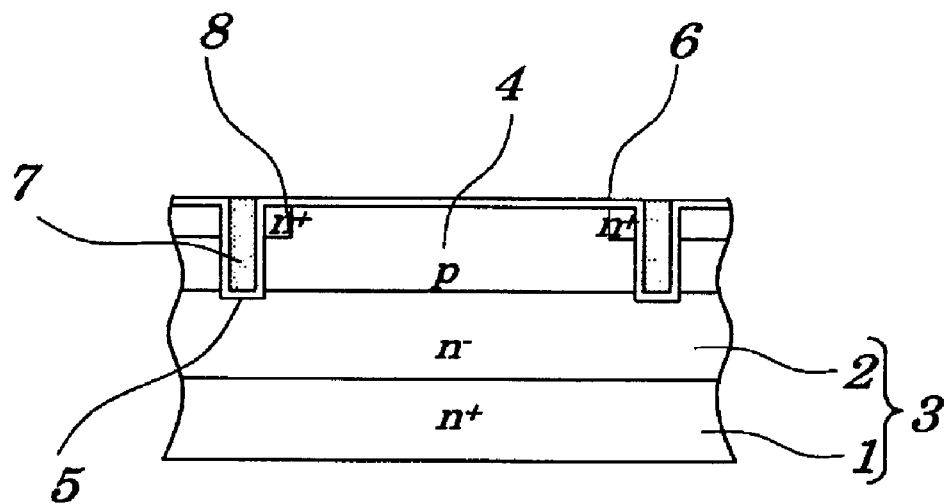

A method of manufacturing the semiconductor device 10 of the embodiment will be described by referring to FIGS. 4A through 6B. FIGS. 4A, 5A and 6A are cross-sectional views of the semiconductor device 10 of FIG. 1 taken along the line A—A. FIGS. 4B, 5B and 6B are cross-sectional views of the semiconductor device 10 of FIG. 1 taken along the line B—B. Actually, though dimensions on the plane of the semiconductor device shown in FIGS. 4A, 5A and 6A are different from those in FIGS. 4B, 5B and 6B, to simplify the description, they are shown in almost same dimensions.

First, as shown in FIGS. 4A and 4B, the N-type drain region 3 is formed which is composed of the $N^-$-type semiconductor layer 2 formed, by epitaxial growth process, on the $N^+$-type semiconductor substrate 1, in which the impurity concentration of the $N^-$-type semiconductor layer 2 is lower than that of the $N^+$-type semiconductor substrate 1. Next, trenches 5 are formed, by etching processing, in the $N^-$-type semiconductor layer 2 existing at portions surrounding the P-type base region 4 described later, by which the cell is partitioned to the plurality of unit cells 9. Then, as shown in FIGS. 5A and 5B, by a thermal oxidation method, the gate oxide film 6 is grown on the whole surface including the surface of the trenches 5. Next, after polysilicon films are formed on the whole surface by a CVD (Chemical vapor Deposition) method, polysilicon films formed on unwanted portions are removed in a manner so as to be buried and left in the trenches 5 only to form the gate electrode 7. Then, as shown in FIGS. 6A and 6B, by performing annealing for 10 minutes to 20 minutes at temperatures 1100° C. to 1200° C. following an ion implantation using boron (B) as a P-type impurity, the P-type base region 4 with a depth of 1 μm to 2 μm is formed on the whole surface of the $N^-$-type semiconductor layer 2 surrounded by the trenches 5. Then, a photoresist film patterned, in accordance with photolithography technology, so as to have planar shapes of a center portion of the P-type base region 4 and of portions formed on diagonal lines extending radially from four corners of the center part of the cell (which corresponds to planar portions on the P-type base region 4 in FIG. 1) is formed on the P-type base region 4. Next, by performing annealing for 25 minutes to 35 minutes at temperatures 980° C., to 1050° C. following the ion implantation using arsenic (As) as the N-type impurity and using the photoresist film as a mask, the $N^+$-type source region 8 with a depth of 0.4 μm to 0.8 μm and the source region narrowing section 11 are, in a selective order, formed on the surface of the P-type base regions 4.

That is, after the P-type base region 4 is formed in advance on the whole surface, by performing the ion implantation with the N-type impurity using the photoresist film patterned to have planar shapes as the mask on the P-type base region 4, at cell corner sections 15 in particular, the source region narrowing section 11 is formed in which the width dimension W1 on the plane of the $N^+$-type source region 8 is limited partially to the width dimension W2. Thus, the $N^+$-type source region 8 is so structured to provide an endless shape because it has the source region narrowing section 11 which allows continuous structure without disconnected portions.

After an interlayer dielectric 12 is formed on the whole surface by the CVD method and the source and base contact aperture section 13 is formed by patterning on the gate oxide film 6 and the interlayer dielectric 12 in accordance with the photolithography, the source electrode 14 is formed so that the P-type base region 4 is connected with the $N^+$-type source region 8 through the source and base contact aperture section 13, thus completing manufacturing of the semiconductor device 10 of the embodiment.

According to the method of manufacturing the semiconductor device 10 of the embodiment, since the trench 5 is first formed in the $n^-$-type semiconductor layer 2 constituting the N-type drain region 3 and, after the gate oxide film 6 and the gate electrode 7 are formed, the formation of the P-type base region 4 and the $N^+$-type source region 8 which requires high temperature treatment is made, thermal influences are not given to the trench 5 and semiconductor crystals disposed in the vicinity of the trench 5, thus allowing formation of the trench structure being stable in terms of property. Conversely, if the trench 5 is formed after the formation of the P- type base region 4 and $N^+$-type source region 8 requiring the high temperature treatment, since the trench 5 is formed in the semiconductor crystals affected thermally due to the high temperature treatment and then the gate oxide film 6 and the gate electrode 7 are formed, the formation of the trench structure being stable in terms of property as the semiconductor device 10 is difficult.

Also, according to the semiconductor device 10 of the embodiment, the source region narrowing section 11 which causes the width dimensions W1 on the plane of the $N^+$-type source region 8 to be partially limited, is formed at the cell corner section 15 existing on the diagonal line L and in the vicinity of the diagonal line L on the rectangular surface of the unit cell 9, the current path, through which a current flows when a semiconductor device 10 breaks down due to inverse voltages, passing through the cell corner 15 and extending from the N-type drain region 3 to the source electrode 14 can be made shorter than the current path which does not pass through the cell corner 15.

Moreover, according to the method of manufacturing a semiconductor device 10 of the embodiment, since formation of the P-type base region 4 and $N^-$-type source region 8 which requires high temperature treatment is made after the formation of the trench 5 in the N-type drain region 1 is first made, the trench 5 and semiconductor crystals existing in the vicinity of the trench 5 are not affected thermally, thus allowing the trench structure being stable in terms of property as the semiconductor device 10. Therefore, it is possible to provide the semiconductor device 10 having structures being suitable for scale-down of cells which is capable of, without the increase in channel resistance, improving the resistance property against device breakdown required when the semiconductor device 10 breaks down due to inverse voltages.

Second Embodiment

Figure 7:
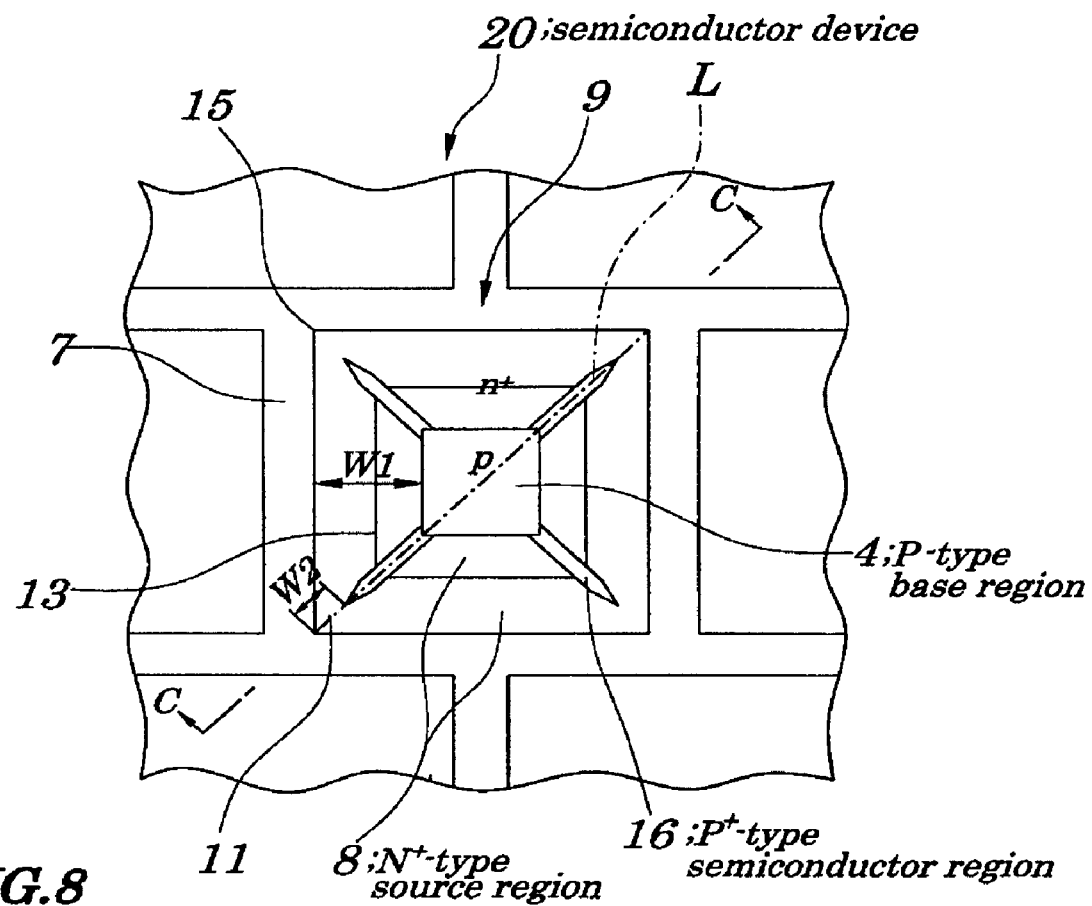
FIG. 7 is a top view showing configurations of a semiconductor device according to a second embodiment of the present invention.
Figure 8:
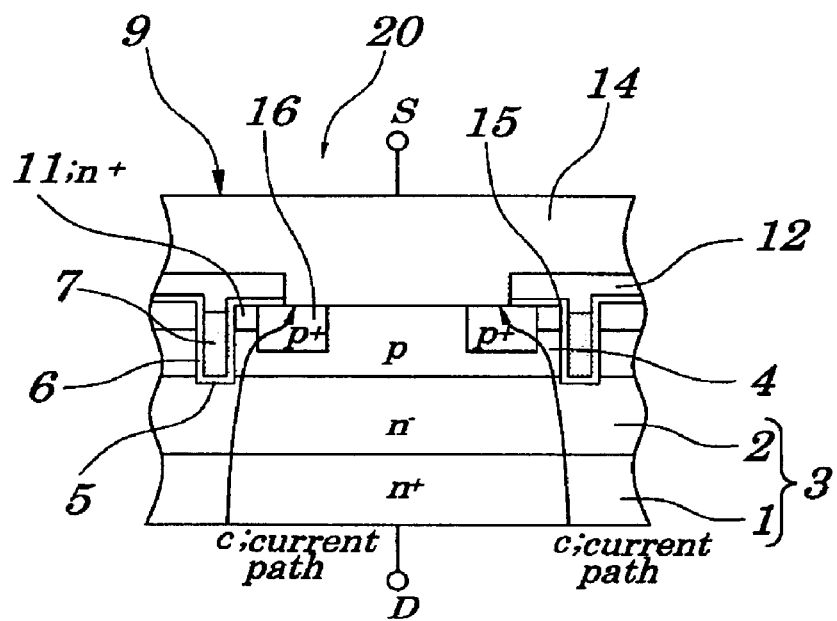
FIG. 8 a perspective view of the semiconductor device of FIG. 7 taken along line C—C.
Figure 9:
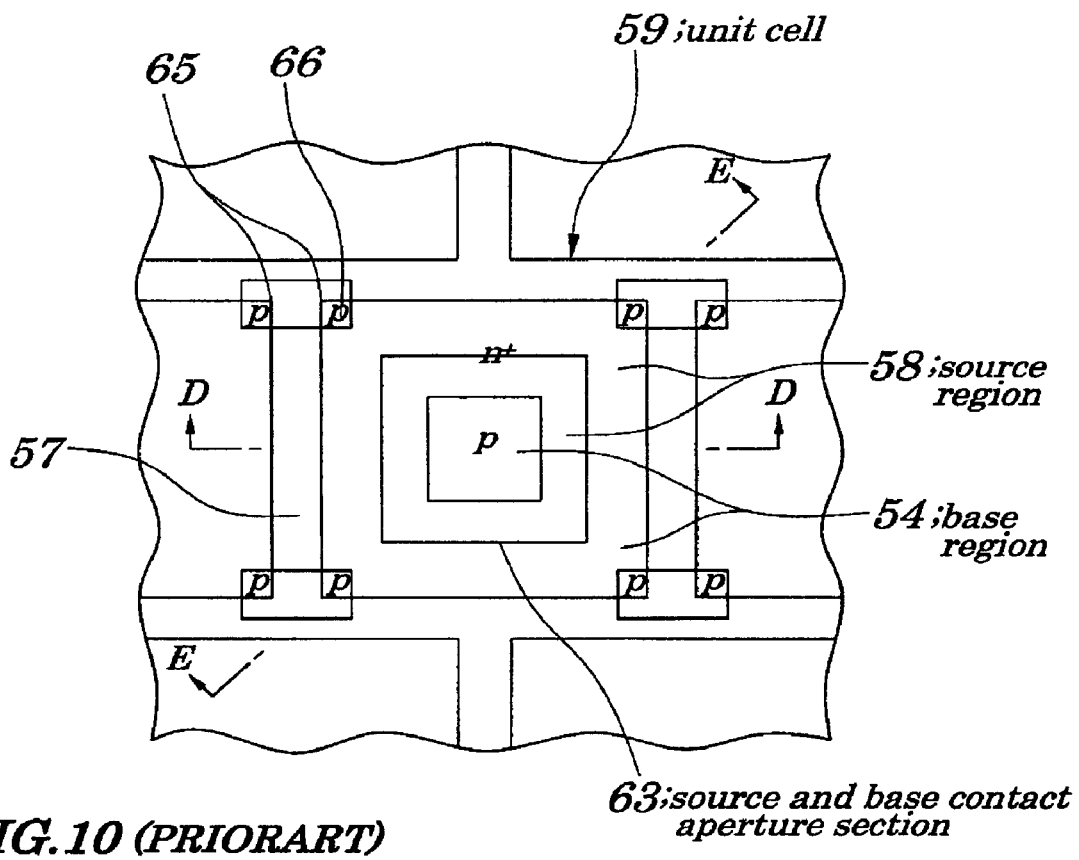
FIG. 9 is a top view showing configurations of a conventional semiconductor device.
Figure 10:
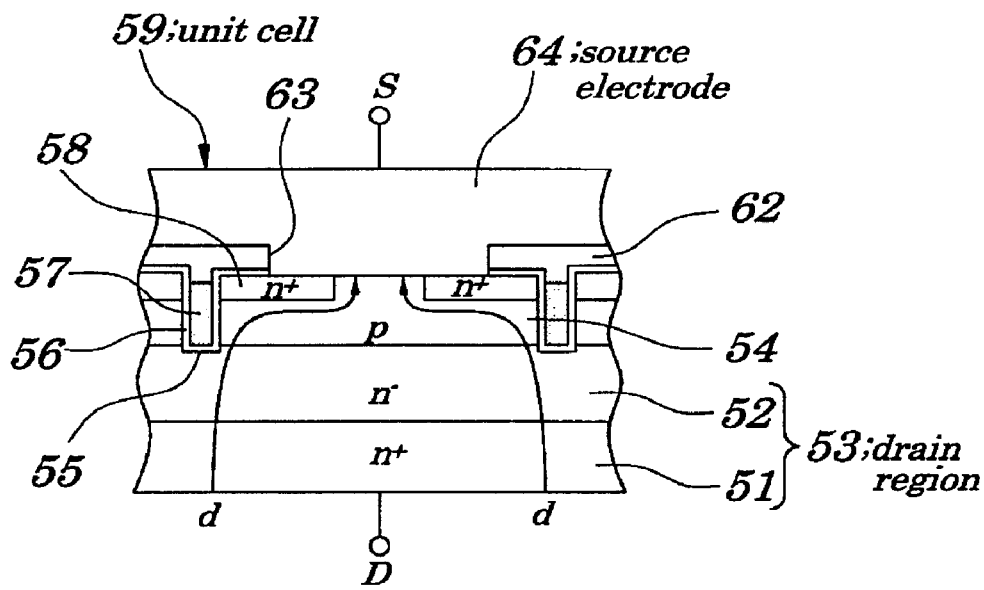
FIG. 10 is a perspective view of the semiconductor device of FIG. 9 taken along line D—D.
Figure 11:
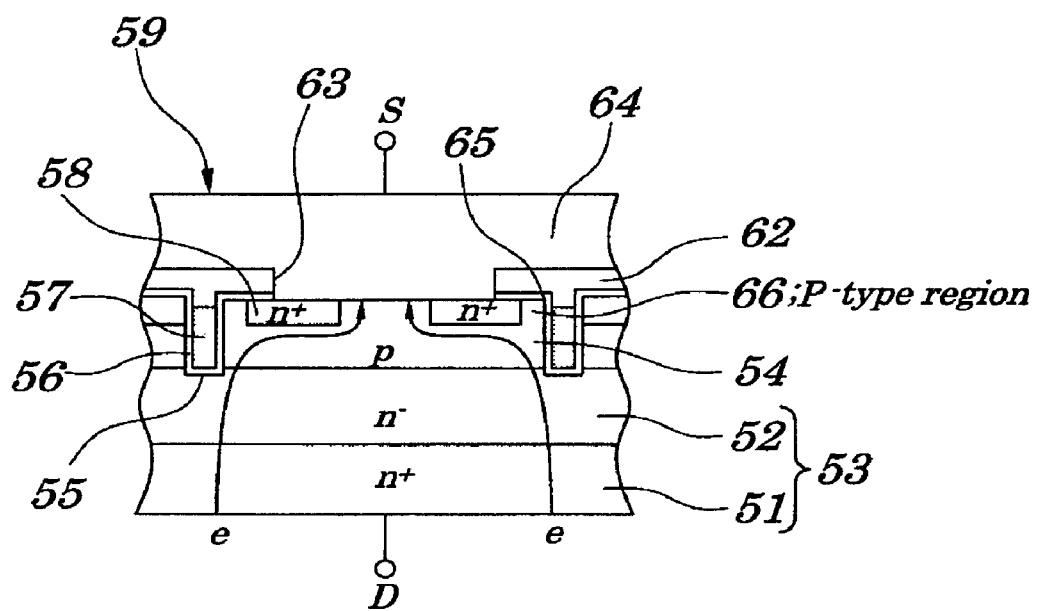
FIG. 11 is a perspective view of the semiconductor device of FIG. 9 taken along line E—E.
Figure 12:
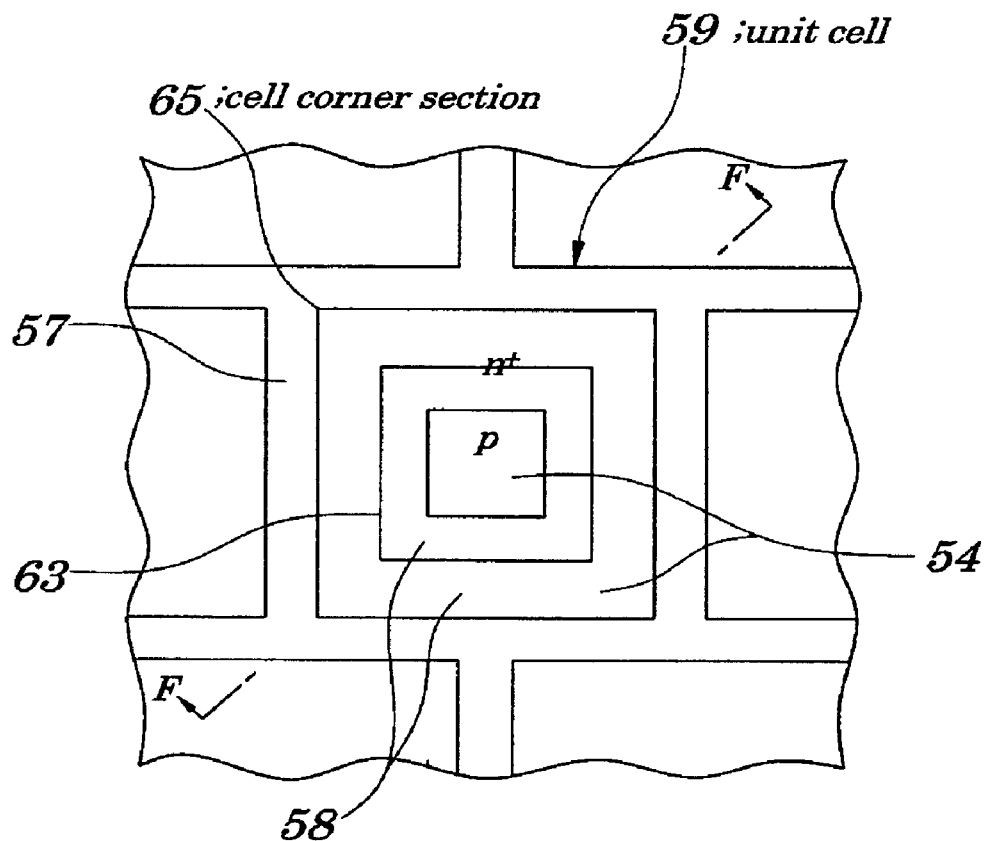
FIG. 12 is a top view showing configurations of a conventional semiconductor device.
Figure 13:
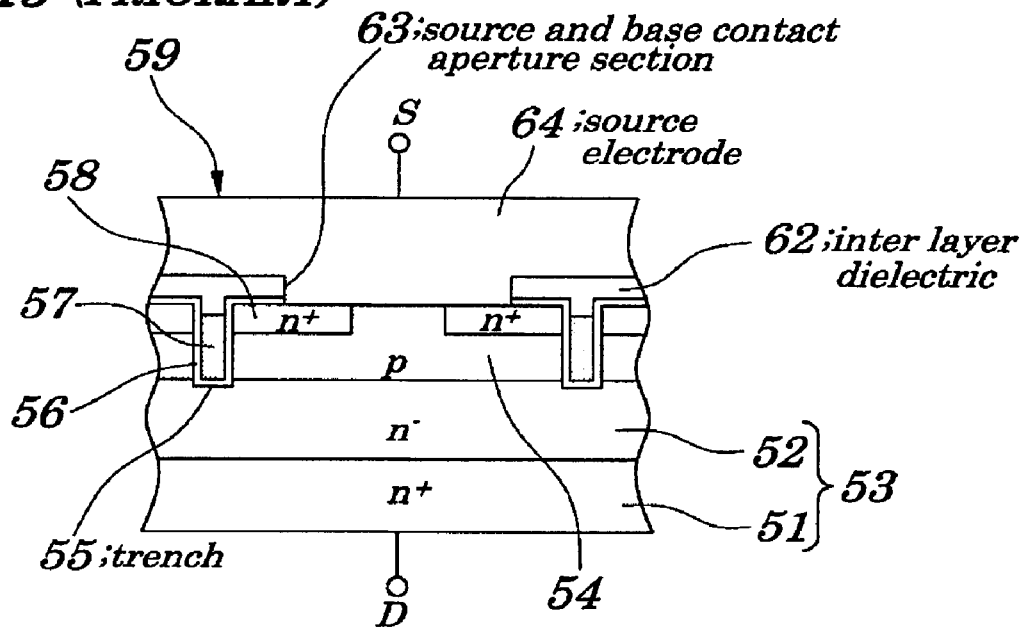
FIG. 13 is a perspective view of the semiconductor device of FIG. 12 taken along line F—F.

FIG. 7 is a top view showing configurations of a semiconductor device 20 according to a second embodiment of the present invention. FIG. 8 a perspective view of the semiconductor device 20 of FIG. 7 taken along line C—C. Configurations of the semiconductor device 20 of the second embodiment differ from those of the first embodiment in that a structure of the source region narrowing section is changed to have special features.

In the semiconductor device 20 of this embodiment, as shown in FIG. 7 and FIG. 8, a $p^+$-type semiconductor region 16 containing an impurity concentration being lower than that contained in a p-type base region 4 is first formed at a portion of a region in which an $n^+$-type source region 8 is to be formed and then the $n^+$-type source region 8 is formed in a manner that a source region narrowing section 11 is mounted at a same time.

The semiconductor device 20 of the embodiment is manufactured by almost same procedures as those in the first embodiment shown in FIG. 6A and FIG. 6B, except processes subsequent to formation of the p-type base region 4. That is, after the p-type base region 4 is formed, a first photoresist film patterned, in accordance with photolithography technology, to have planar shapes of a center portion of the p-type base region 4 and of portions formed on diagonal lines extending radially from four corners of a center part of a unit cell 9 (which corresponds to the $p^+$-type semiconductor region 16 in FIG. 8) is formed on the p-type base region 4 and then by ion implantation with boron difluoride ($BF_2$) using the first photoresist film as a mask and annealing for 25 to 35 minutes at temperatures 980° C. to 1050° C., the $p^+$-type semiconductor region 16 with a depth of 0.5 μm to 1.0 μm is formed on the surface of the p-type base region 4.

A second photoresist film patterned, in accordance with photolithography technology, to have planar shapes of the center portion of the p-type base region 4 and of portions formed on diagonal lines extending radially from four corners of the center part of the unit cell 9 (which corresponds to the $p^+$-type semiconductor region 16 in FIG. 8) is formed on the p-type base region 4 and then by ion implantation using the second photoresist film as the mask and using arsenic (As) as the n-type impurity and by annealing for 25 to 35 minutes at temperatures 980° C. to 1050° C., the $p^+$-type semiconductor region 16 with a depth of 0.4 μm to 0.8 μm and the source region narrowing section 11 are, in a selective order, formed on the surface of the p-type base region 4.

That is, the $p^+$-type semiconductor region 16 is formed by the ion implantation with the p-type impurity using the first photoresist film patterned to have planar shapes as described above as the mask on the P-type base region 4 which is formed in advance on the whole surface and the source region narrowing section 11, in which the width dimension W1 on the plane of the $N^+$-type source region 8 is partially limited to the width dimension W2, is formed by the ion implantation with the N-type impurity using the second photoresist film patterned to have the planar shapes as described above at a cell corner section 15 on a rectangular surface of the unit cell 9 in particular, as in the first embodiment. Thus, the $N^+$-type source region 8 is so structured to provide an endless shape because it has the source region narrowing section 11 which allows continuous structure without disconnected portions.

The processes thereafter in the second embodiment are almost the same as those in the first embodiment. In FIGS. 7 and 8, same reference numbers are assigned to same parts as those in the first embodiment.

According to the second embodiment, as is apparent from a current path "c" shown in FIG. 8, since current flows in a shortest distance on the surface of the $P^+$-type semiconductor region 16 with low resistance when the semiconductor device 20 breaks down due to inverse voltages, voltage drop occurring when the current flows through the P-type base region 4 becomes small, causing a parasitic resistor not to be easily turned ON, thus improving further a resistance property against device breakdown.

Thus, in this embodiment, almost same effect as in the first embodiment can be obtained.

As described above, according to the semiconductor device of the present invention, since the source region narrowing section, in which the width dimensions on the plane of the source region is partially limited, is formed at the cell corner section disposed on the diagonal line and in the vicinity of the diagonal line, the current path through which the current flows from the drain region to the source region through the cell corner when the semiconductor device breaks down due to inverse voltages can be shorter than the current path which does not pass through the cell corner section.

Moreover, according to the semiconductor device of the present invention, after the trench is first formed in the drain region, the formation of the base region and source region which requires high temperature treatment is made, thermal influences are not given to the trench and semiconductor crystals disposed in the vicinity of the trench, thus allowing the formation of the trench structure being stable in terms of property as the semiconductor device.

Thus, the present invention can provide the semiconductor device having structures being suitable for scale-down of unit cells which is capable of, without the increase in channel resistance, improving the resistance property against semiconductor device breakdown required when the semiconductor device breaks down due to inverse voltages.

It is apparent that the present invention is not limited to the above embodiments but may be changed and modified without departing from the scope and spirit of the invention. For example, as a conductive type of each semiconductor region constituting the semiconductor device, the N-type instead of the P-type or vice-versa may be used as well. Moreover, the drain region may be formed by methods other than epitaxial growth method, for example, it may be formed by being doped externally with an impurity by the ion implantation followed by adjustment of the impurity concentration.

Furthermore, the present invention may be applied not only to a MOSFET using oxide but also to a MISFET (Metal Insulator semiconductor FET) composed of a general metal insulator. Each of semiconductor regions, trenches, forming conditions for interlayer dielectrics, ion source used in the ion implantation employed in the embodiment described above are one of examples and therefore may be changed as necessary.

Finally, the present application claims the priority of Japanese Patent Application No. Hei11-236186 filed on Aug. 23, 1999, which is herein incorporated by reference.

What is claimed is:

1. A semiconductor device having a plurality of trench-structured rectangular unit cells comprising:
   a first conductive type drain region;
   a second conductive type base region formed adjacent to said first conductive type drain region;
   a trench formed in an area surrounding said second conductive type base region;
   a gate electrode formed within said trench with a gate insulating film interposed between said gate electrode and said trench;
   a first conductive type source region having a continuous shape formed along said trench on the surface of said second conductive type base region; and
   a region having no source is formed at a center of a rectangular surface of each of said trench-structured rectangular unit cells and extends outwardly on diagonal lines that radially extend from said center towards corners of each of said trench-structured rectangular unit cells.

2. A semiconductor device having a plurality of trench-structured rectangular unit cells comprising:
   a first conductive type drain region;
   a second conductive type base region formed adjacent to said first conductive type drain region;
   a trench formed in an area surrounding said second conductive type base region;
   a gate electrode formed within said trench with a gate insulating film interposed between said gate electrode and said trench;
   a first conductive type source region having a continuous shape formed along said trench on the surface of said second conductive type base region; and
   a source region narrowing section which partially limits width dimensions on a plane of said first conductive type source region is formed on diagonal lines on a rectangular surface of said trench-structured rectangular unit cells and in a vicinity of said diagonal lines of said trench-structured rectangular unit cells, wherein said diagonal lines extend from corners of said rectangular surface towards a center of said rectangular surface, and said source region narrowing section has a width which is less than a width of other sections of said first conductive type source region.

3. The semiconductor device according to claim 2, wherein each of said trench-structured rectangular unit cells is coated with an interlayer dielectric in which a source and base contact aperture section is formed and a source electrode is formed through said source and base contact aperture section.

4. The semiconductor device according to claim 3, wherein said source region narrowing section is so structured that said first conductive type source region is narrowed by an arbitrary dimension on said diagonal lines of each of said first conductive type unit cells in a direction from said source and base contact aperture section in said interlayer dielectric toward a corner section of each of said trench-structured rectangular unit cells.

5. The semiconductor device according to claim 2, wherein said source region narrowing section is formed at a time of formation of said first conductive type source region after a second conductive semiconductor region containing an impurity concentration being higher than that of said second conductive type base region is formed in advance at a part of a place where said first conductive type source region is to be formed.

* * * * *